United States Patent [19]

Goser

[11] 4,283,696
[45] Aug. 11, 1981

[54] METHOD AND CIRCUIT ARRANGEMENT FOR THE OPERATION OF RECURSIVE FILTER CIRCUITS OR ANALOG STORAGE CIRCUITS CONSTRUCTED ACCORDING TO THE CHARGE COUPLED DEVICE (CCD) PRINCIPLE

[75] Inventor: Karl Goser, Munich, Fed. Rep. of Germany

[73] Assignee: Siemens Aktiengesellschaft, Berlin and Munich, Fed. Rep. of Germany

[21] Appl. No.: 69,790

[22] Filed: Aug. 27, 1979

[30] Foreign Application Priority Data

Sep. 26, 1978 [DE] Fed. Rep. of Germany ....... 2841832

[51] Int. Cl.³ ..................... H03H 17/04; G11C 27/00
[52] U.S. Cl. ............................... 333/165; 307/221 D; 328/167; 333/173; 357/24
[58] Field of Search ....................... 333/165, 166-168, 333/173, 28 R; 307/221 R, 221 C, 221 D, 295, 304; 357/24; 364/825-827, 833, 844, 862, 724-726; 328/167

[56] References Cited

U.S. PATENT DOCUMENTS

| | | | |
|---|---|---|---|
| 3,947,698 | 3/1976 | Cheek, Jr. et al. | 307/221 D |
| 4,035,628 | 7/1977 | Lampe et al. | 364/825 X |
| 4,100,513 | 7/1978 | Weckler | 357/24 X |
| 4,145,675 | 3/1979 | Picquendar | 307/221 D X |

OTHER PUBLICATIONS

Butler et al.—"Practical Considerations for Analog Operation of Bucket-Brigade Circuits", IEEE Journal of Solid-State Circuits, vol. SC-8, No. 2, Apr. 1973; pp. 157-168.

Smith et al.—"Active Bandpass Filtering with Bucket-Brigade Delay Lines", IEEE Journal of Solid-State Circuits, vol. SC-7, No. 5, Oct. 1972; pp. 421-425.

*Primary Examiner*—Marvin L. Nussbaum
*Attorney, Agent, or Firm*—Hill, Van Santen, Steadman, Chiara & Simpson

[57] ABSTRACT

The invention relates to a method for operating recursive filter circuits or analog storage circuits constructed according to the charge coupled device principle and to a circuit arrangement for implementing the method, in which method only each respective second stage a CCD is occupied with a charge representing a sampling value of an analog signal and the respective stages lying between these stages concerned are left empty. Known circuits constructed according to the CCD principle conduct the signal from the output stage of a CCD chain to the input of the CCD loop via an amplifier to which the input signal is supplied at the same time. Thereby, the amplification must very precisely amount to 1. An amplifier of the high stability required for that purpose which is arranged in common with the CCD concerned on a chip cannot be satisfactorily realized. A method is specified by means of the invention in which the amplifier is replaced by modulation of a sampling value with a reference signal and by means of a charge amount corrected in accord with the result of the modulation.

3 Claims, 5 Drawing Figures

4,283,696

METHOD AND CIRCUIT ARRANGEMENT FOR THE OPERATION OF RECURSIVE FILTER CIRCUITS OR ANALOG STORAGE CIRCUITS CONSTRUCTED ACCORDING TO THE CHARGE COUPLED DEVICE (CCD) PRINCIPLE

INTRODUCTION

The invention relates to a method for operating recursive filter circuits or analog storage circuits constructed according to the charge coupled device (CCD) principle and to a circuit arrangement for implementation of the method in which only each respective second stage of a CCD is occupied with a charge representing a sampling value of an analog signal and the stages respectively lying between these stages concerned are left empty.

PRIOR ART

Known recursive filter circuits constructed according to the CCD principle conduct the signal from the output stage of a CCD chain to the input of the CCD loop via an amplifier to which the input signal is simultaneously supplied, c.f., for example, IEEE Journal of Solid State Circuits SC-7 (1972) October, pages 421 through 425; SC-8 (1973) April, page 157; Conference volume of the CCD 74, Edinburgh: "Signal Processing Application of Charge-Coupled-Devices" and "MTI Filtering for Radar with CCD"; 6th International Congress of Microelectronics: "Charge-Coupled-Devices". So that a good filter effect is achieved, the amplification must amount to 1 very precisely. Namely, given amplification that is too low, the quality of the filter would be too low, given amplification that it too high, self-oscillation would occur.

According to the present state of knowledge, an amplifier of the necessary high stability which is arranged in common on a chip with the CCD concerned cannot be satisfactorily realized.

BACKGROUND OF THE INVENTION

It has been proposed that the critical amplifier be eliminated. To that end, it has been proven that, in principle, no amplifier is required in a CCD loop because the low transmission losses with given CCD's allow one to expect a sufficiently high quality of the filter circuit. If one allows an information to circulate in a closed CCD loop, then the problems resulting from an amplifier of high stability are eliminated. However, such a CCD loop is not functional over a long time without additional devices, since the potential troughs of the individual stages become filled with charge carriers which derive from inverse currents and incomplete charge transfer. Therefore, it must be seen to with an auxiliary circuit that these parasitic charges are again removed and, thus, the operating point of the CCD loop is retained. The operating point is defined by the charge amount in the potential troughs in the idle state of the stages.

BRIEF SUMMARY OF THE INVENTION

The object of the present invention is to provide a method for the operation of a circuit of the said type and to specify a circuit arrangement for implementing the method, whereby the problems revealed are solved in a simple manner and with low circuit outlay.

The said object is inventively achieved by means of a method for operating recursive filter circuits constructed according to the charge couple device (CCD) principle in which only each respective second stage of a CCD is occupied with a charge representing a sampling value of an analog signal and the respective stages lying between these stages concerned are left empty, said method being characterized in that charges representing reference values of a reference signal are inserted between the charges representing the individual sampling values of a useful signal; in that a sampling value of an analog signal received in a CCD loop under consideration from a preceding CCD loop is modulated with a reference value; in that the difference between the sampling value modulated in that manner and the respective original reference value is formed; and in that, in accord with the difference formed, a missing charge amount is supplied to the CCD input concerned or an excess charge amount is removed from the CCD input concerned.

An inventive circuit arrangement for implementing this method is characterized in that at least one CCD loop is provided to which signals can be supplied to a first connection point via an input and an input signal amplifier and from which signals can be taken at a second connection point via an output signal amplifier and an output; and in that an auxiliary device is provided by means of which charge can be taken from the CCD loop or charge can be introduced into the CCD loop via a connection with one of the connection points of the CCD loop in accord with the difference formed between a modulated sampling value and the respective reference value.

The invention offers the advantage that all problems arising because of an amplifier present in the prior art are avoided and that filter circuits of high quality may be realized despite the lack of such an amplifier. Although the packing density of a filter circuit operated according to the inventive method is reduced in comparison to the packing density of traditional filter circuits, this state of affairs is not to be evaluated as being disadvantageous since filter circuits of the said type usually only have relatively short CCD loops with a the number of stages being between 10 and 40.

A further development of the invention is characterized in that the auxiliary device is provided as a modulator integrated into the CCD loop; in that, for the modulator connected to a clock pulse electrode of a CCD chain of the CCD loop, a first control electrode, a first evaluator electrode, a second evaluator electrode, a second control electrode and a diffusion area serving as a charge carrier sink, or, respectively, source are arranged in such manner that, in a first evaluation step, a charge amount corresponding to the potential difference is available under the first evaluator electrode after termination of this evaluation step, given SO>Sn in that to the first, or, respectively, second evaluator electrode is applied the potentials proportional to the signal amplitudes concerned and to the second control electrode and the diffusion area are applied a potential suited for an evaluation and that, in a second evaluation step, to the first control electrode and the clock pulse electrode of the CCD chain are applied potentials suitable for an evaluation. Given SO>Sn after termination of this second evaluation step the charge previously collected under the first evaluator electrode is brought under the clock pulse electrode, or given SO<Sn, a charge amount corresponding to the potential difference has collected under the second evaluator electrode, which charge amount is then removed in a third evaluation step into the diffusion area functioning as a charge carrier sink.

BRIEF DESCRIPTION OF THE DRAWINGS

In the following, the invention is explained on the basis of a number of figures relating to sample embodiments of the invention.

DESCRIPTION OF THE PREFERRED EMBODIMENTS

Figure 1:
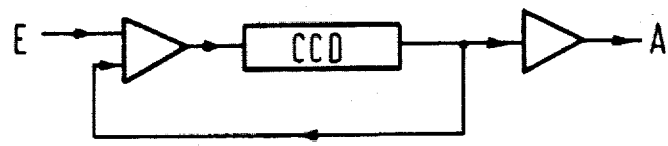
FIG. 1 shows the block diagram of a recursive filter circuit according to the prior art.
Figure 2:
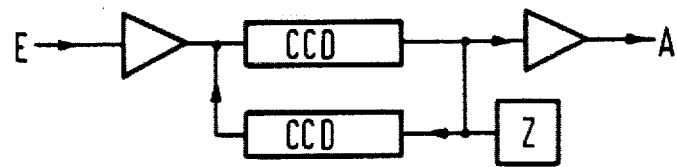
FIG. 2 shows the fundamental block diagram of a sample embodiment of the inventive circuit arrangement.

As already mentioned, FIG. 1 shows the block diagram of a recursive filter circuit according to the prior art. In such an arrangement, the problems initially cited occur because of the incorporation of an amplifier into the information loop. Inventively, c.f. FIG. 2, such an amplifier is eliminated. A closed CCD loop is provided to which signals can be supplied at a first connection point via an input E and an input signal amplifier and from which signals can be taken at a second connection point via an output signal amplifier and an output A. Moreover, an auxiliary device Z is provided by means of which charge can be removed from the CCD loop or charge can be introduced into the CCD loop via a connection with one of the connection points of the CCD loop corresponding to the difference formed between a modulated sampling value and the respective reference value.

Figure 3:
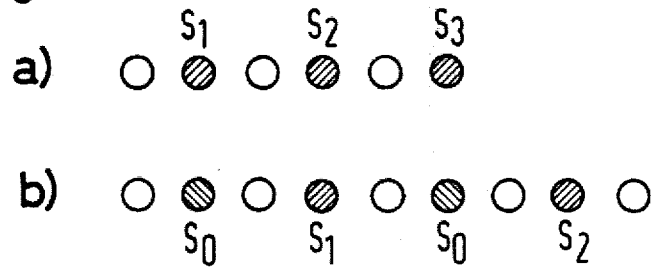
FIG. 3 shows, under (a), the charge movement pattern known from the prior art and under (b), the inventive charge movement pattern.

As already mentioned, FIG. 3 shows the charge movement pattern known from the prior art under (a) and the inventive charge movement pattern under (b). In contrast to the operating procedure known according to (a) in which spaces are introduced into the information flow between the charges respectively representing sampling values S1, S2, S3 . . . of an analog signal, charges representing reference values SO of a reference signal are additionally inserted according to the invention in the manner illustrated between the charges representing the sampling values S1, S2 . . . . When an analog signal according to the charge movement pattern according to FIG. 3(a) is transmitted via a CCD, then only every second stage is occupied with a charge. The stages lying respectively between them remain empty. It is thereby achieved that the individual charges cannot mutually influence one another. Beyond that, for the stabilization of the operating point, reference values SO of a reference signal are inventively inserted between the charges representing the individual sampling values S1, S2 . . . , which, for example, are characterized by means of semi-full (half-full) potential cells. The signal amplitudes characterizing the idle state of a stage and deriving from the reference values SO are employed to stabilize the operating point of the CCD loop and to eliminate the influence of the inverse currents.

Figure 4:
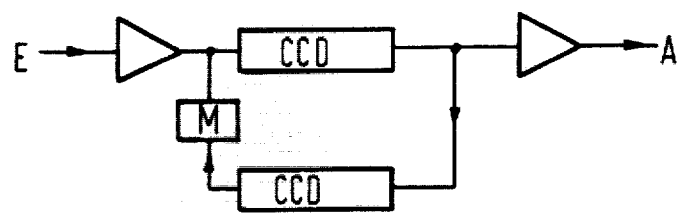
FIG. 4 shows the block diagram of an inventive circuit arrangement according to a further development of the invention.

As already mentioned, FIG. 4 shows the block diagram of an inventive circuit arrangement according to a further development of the invention. The auxiliary device Z shown in FIG. 2 is here executed as a modulator M integrated in the CCD loop, the internal structure and manner of functioning of said modulator being schematically shown in FIG. 5. For setting the idle potential determining the operating point of the CCD, a reference signal SO is continuously input into the CCD concerned via the input E. Its level is modulated with the useful signal which comes from the preceding CCD loop. At the output of the CCD loop, the transmitted signals are determined by means of comparison in the modulator M with the idle levels SO likewise transmitted and are supplied to the input. Since the difference between the useful signal and the reference signal is formed, the charge amount supplied by inverse currents is removed. Thereby, it is approximately assumed that the influence of the inverse currents is dependent on the charge amount transported. A closed CCD loop is given with the specified circuit arrangement with which, if the modulator is likewise designed as a CCD stage, any kind of critical amplifier stage can be avoided.

Figure 5:
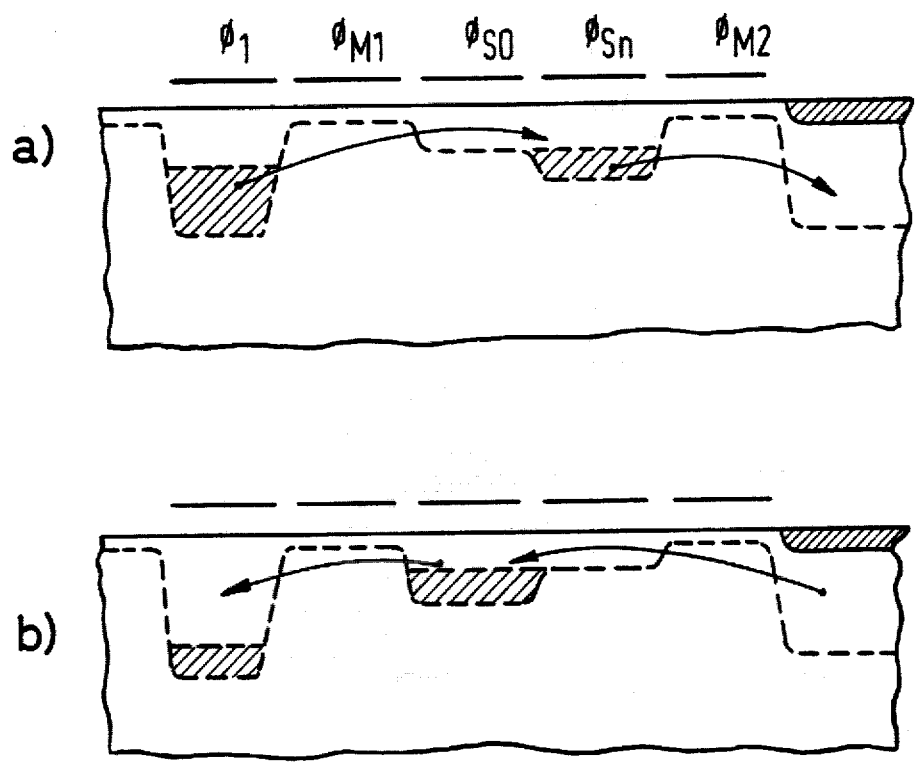
FIG. 5 schematically illustrates the arrangement and the manner of functioning of a modulator constructed like a CCD stage for the formation of the difference between the signals SO and Sn.

In the following, a CCD stage for the formation of differences is described in detail:

Connected to a CCD chain, there are arranged first and second control electrodes $\phi$M1 and $\phi$M2, first and second evaluator electrodes $\phi$SO and $\phi$Sn coming from a "floating gate amplifier" and a diffusion area as charge carrier trough, or respectively, source, c.f. FIG. 5. In a first evaluation step, the areas under the electrodes $\phi$SO and $\phi$Sn which lie at potentials proportional to the signals SO and Sn are flooded with charges in that an appropriate voltage is applied between $\phi$M2 and the diffusion area. When this voltage is switched off, then charges remain under the electrode $\phi$SO only for the case when SO is greater than Sn. In the other case, the entire charge again flows back. In a second evaluation step, the areas under the electrodes $\phi$SO and $\phi$Sn are likewise flooded with charge; however, in this case, a voltage is connected between the neighbouring clock pulse electrode $\phi$1 of the CCD and the electrode $\phi$M1. After switching off the voltage the charge previously stored for the case SO>Sn has flowed into the CCD, c.f., FIG. 5(b). In the other case, namely SO<Sn, a charge is stored under the electrode $\phi$Sn, i.e., is taken from the CCD. In a third evaluation step, this charge is supplied to the diffusion area which, in this case, represents a trough, c.f., FIG. 5(a). It is thus achieved with the specified circuit arrangement, that, in accord with the difference between SO and Sn, a charge is either supplied to or removed from the CCD input and, thus, the input signal is modulated.

This stage functioning according to the CCD principle and the "floating gate" principle can advantageously be easily integrated into the CCD loop and exhibits a high stability since no external voltage magnitudes enter into the behaviour of the circuit as an analog circuit.

Given arrangement of a plurality of CCD loops in a filter circuit, the same charge amount can be advantageously removed from all stages concerned after the respective read-out of the reference values. Moreover, it is advantageous to remove charge carriers supplied by inverse currents to the stages left empty per se with the clock pulse concern.

Although the invention has been described with respect to preferred embodiments, it is not to be so limited as changes and modifications can be made which are within the full intended scope of the invention as defined by the appended claims.

I claim as my invention:

1. A method of operating recursive filters utilizing charge coupled devices having plural storage cells comprising the steps of storing in first alternate storage cells of said charge coupled devices sampling values (Sn) of an analog signal, storing in second alternate storage cells of said charge coupled devices reference charge levels (SO), comparing each of said sampling values (Sn) with said reference values (SO) and increasing or decreasing said sampling values (Sn) in response to such comparison.

2. A recursive filter circuit comprising a first CCD chain having an input stage and an output stage, a first amplifier feeding into said input stage of said first CCD chain through a first circuit point, a second amplifier, the output stage of said first CCD chain being connected to said second amplifier through a second circuit point, a second CCD chain, a modulator connected in series with said second CCD chain between said second and first circuit points, and said modulator comparing the charge levels of incoming intelligence (Sn) with a reference charge level (SO) and modifying charge levels of incoming intelligence (Sn) to standard charge values either greater or smaller than said reference charge level (SO).

3. A filter circuit according to claim 2 wherein said modulator comprises a storage device with a plurality of storage cells, a plurality of electrodes mounted over said plurality of aligned storage cells and said plurality of electrodes comprising a first control electrode, ($\phi M1$) a first evaluator electrode ($\phi SO$), a second evaluator electrode ($\phi Sn$), a second control electrode ($\phi M2$), a diffusion storage cell adjacent the last of said storage cells for supplying or removing charges, said second charge coupled device having a clock pulse electrode, said modulator connected to receive the charges from said clock pulse electrode of said second charge coupled device, and said charges are evaluated under said first and second evaluator electrodes such that the charge under said clock pulse is increased or decreased to standard values depending upon whether $SO > Sn$ or $So < Sn$.

* * * * *